United States Patent [19]

French et al.

[11] 4,389,615

[45] Jun. 21, 1983

[54] CCD DEMODULATOR CIRCUIT

[75] Inventors: Barry T. French, Fullerton; Michael J. McNutt, Yorba Linda, both of Calif.

[73] Assignee: Rockwell International Corporation, El Segundo, Calif.

[21] Appl. No.: 379,244

[22] Filed: May 17, 1982

Related U.S. Application Data

[63] Continuation of Ser. No. 70,560, Aug. 29, 1979.

[51] Int. Cl.$^3$ .................... H03D 1/00; H03D 3/18
[52] U.S. Cl. ................................ 329/101; 329/110; 329/135; 329/50; 357/24; 455/214
[58] Field of Search ............... 329/110, 135, 50, 126, 329/101; 455/214; 357/24; 307/221 D

[56] References Cited

U.S. PATENT DOCUMENTS

| | | |
|---|---|---|
| 3,781,574 | 12/1973 | White et al. |
| 3,961,275 | 6/1976 | Kochsmeier |
| 3,986,198 | 10/1976 | Kosonocky |
| 4,010,484 | 3/1977 | Mohsen |
| 4,032,952 | 6/1977 | Ohba et al. |
| 4,051,469 | 9/1977 | Ninomiya |
| 4,139,784 | 2/1979 | Sauer |
| 4,158,209 | 6/1979 | Levine |

FOREIGN PATENT DOCUMENTS 2129420 1/1977 Fed. Rep. of Germany.
2721812 11/1978 Fed. Rep. of Germany.
2805506 8/1979 Fed. Rep. of Germany.

OTHER PUBLICATIONS

Electronics Letters, vol. 15, No. 16, Aug. 1979, F. G. A. Coupe, "Digital Frequency Discriminator", pp. 489 to 490.

Primary Examiner—Siegfried H. Grimm
Assistant Examiner—Edward P. Westin
Attorney, Agent, or Firm—H. Fredrick Hamann; Daniel R. McGlynn

[57] ABSTRACT

A semiconductor integrated circuit using charged coupled device (CCD) technology for performing demodulation of time-varying signals which have been phase or amplitude modulated. The CCD circuit performs a sampling of the time-varying signal at a suitable sampling frequency depending upon the frequency of the phase or amplitude modulation of the carrier. The CCD device converts the sample into an equivalent charge packet which is used to control the control electrode of a field effect transistor in an amplifier circuit. The magnitude of the sample is representative of the amplitude of the carrier so that the output of the field effect transistor represents a demodulated signal. The circuit is a broad spectrum device, operable with a signal frequency from the audio into the gigaHertz (GHz) frequency range.

14 Claims, 9 Drawing Figures

| Diode (1) Switch \ Diode (2) Switch | ON | OFF |
|---|---|---|
| ON | $Q = Q_C - Q_A + Q_B \cos \phi$ | $Q_C - Q_B$ |
| OFF | $Q_C - Q_A$ | $Q_C$ |

CCD DEMODULATOR CIRCUIT

This application is a continuation, of application Ser. No. 070,560, filed Aug. 29, 1979.

BACKGROUND OF THE INVENTION

The present invention is concerned with a circuit for performing demodulation of phase or amplitude modulated time-varying signals. Although various types of demodulators are known in the art, none are capable of operating directly on signals having frequencies ranging from the audio into the gigaHertz (GHz) range. Those UHF and SHF demodulators which do exist are fairly complex, and there are limits in the type of applications in which such devices can be used.

Moreover, the present invention is preferably implemented as a semiconductor integrated circuit using charge coupled device (CCD) technology. More particularly, the device uses a known type of CCD input circuit known as the Tompsett or "fill and spill" input, described in U.S. Pat. No. 3,881,117.

Although various applications of CCD circuits to high frequency signal processing is known (e.g., U.S. Pat. Nos. 4,152,606 and 4,159,430), it was not known in the prior art to directly apply the "fill and spill" input circuit to RF signals. Moreover, there was no teaching to such prior art about the desirability of using CCD technology in radio frequency circuit applications.

SUMMARY OF THE INVENTION

Briefly, and in general terms, the invention is concerned with phase or amplitude demodulator circuits, and in particular with broad spectrum demodulators capable of operating in the frequency range from audio frequencies up to the high gigaHertz frequency range, (i.e. 100 GHz or more). The invention is moreover concerned with a semiconductor integrated circuit utilizing charge coupled device technology for providing such a demodulator.

The device according to the present invention consists of a charge coupled demodulator circuit comprising first input means for introducing into a first portion of the circuit a predetermined amount of charge; storage well means functioning to store a predetermined amount of charge in a second portion of the circuit spaced apart from the first portion; second input means for introducing a time-varying signal containing information in the form of amplitude modulation into the circuit; the second input means functioning to cause charge to be transported during a first time interval from the first portion to the second portion, and during a subsequent second time interval from the second portion in the direction of the first portion, so that at the end of a single first and a predetermined plurality of subsequent successive second time intervals a quantity of charge remains in the storage well representative of the amplitude of the time-varying signal; and transfer means connected to the storage well for transferring the quantity of charge remaining in the storage well means during a third time interval subsequent to the predetermined plurality of second time intervals to an output.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings

DESCRIPTION OF THE PREFERRED EMBODIMENT

Figure 1:
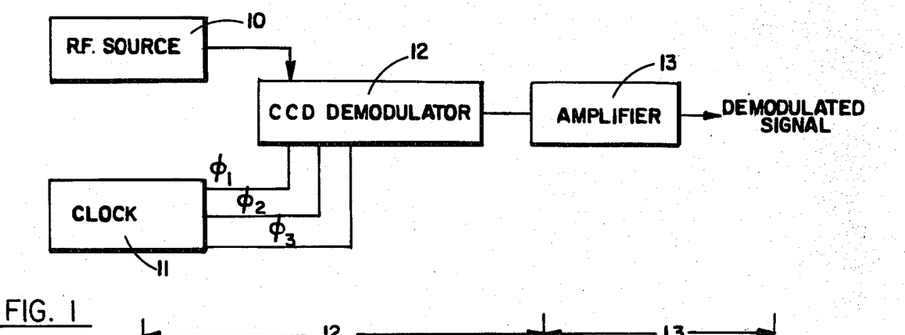
FIG. 1 is a highly simplified block diagram of the demodulator system according to the present invention.

Turning now to FIG. 1, there is shown a highly simplified block digram of the demodulator system according to the present invention. A source of a modulated time-varying signal, such as a radio frequency (RF) source is designated by block labeled 10. A clock circuit designated by block labeled 11 provides three nonoverlapping clock signals $\phi_1$, $\phi_2$, and $\phi_3$. Such clock signals are applied to the CCD demodulator circuit 12 according to the present invention. The output signal is amplified by an amplifier 13 which provides a demodulated signal of the phase or amplitude modulated time-varying signal according to the present invention.

Figure 2:
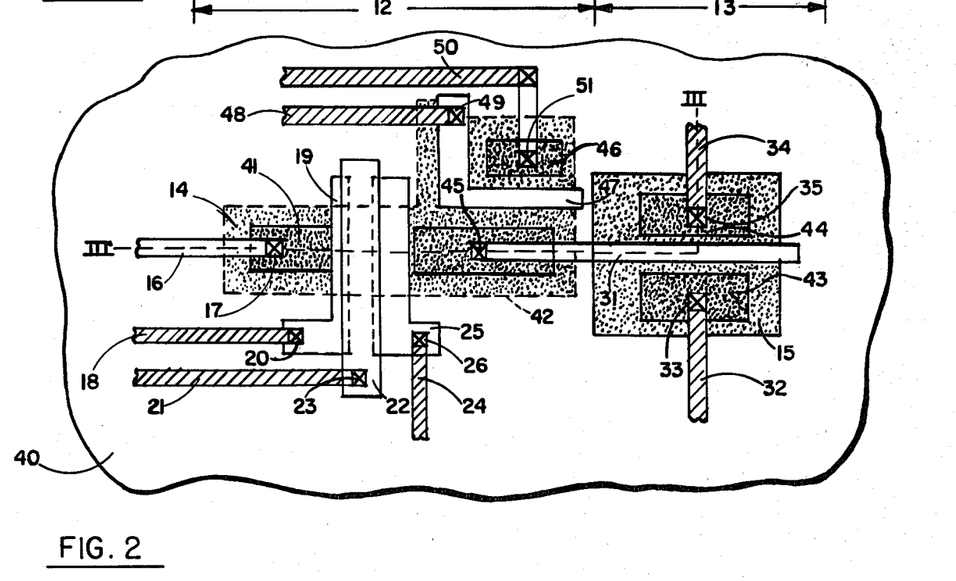
FIG. 2 is a top plan view of a semiconductor integrated circuit incorporating the present invention.

Turning now to FIG. 2, there is shown a top view of a semiconductor implementation of the CCD demodulator according to the present invention. A monocrystalline silicon semiconductor substrate 40, typically of p type conductivity, supports the CCD demodulator 12 and the amplifier 13 as shown in FIG. 1.

In the preferred embodiment according to the present invention, a p-type silicon substrate with CCD and MOSFET devices are described, however it must be realized that other semiconductor materials, or other circuits and transistor devices may be used as well.

FIG. 2 in particular shows a first semiconductor region 14 of second conductivity type (e.g. n type) forming a surface region on the semiconductor substrate 40. Formed within the first region 14 are first and second discrete, spaced apart surface subregions 41 and 42 respectively also of n type conductivity but having a dopant concentration higher than that of the region 14. An insulating layer (not shown) lies over the surface regions, except for contact areas which make external electrical connection with active semiconductor regions possible. A contact 17 makes electrical and physical contact with the first semiconductor region 41 for the purpose of supplying an input signal thereto. The contact 17 is connected to an input line 16 which is formed by an aluminum (or polysilicon) layer or strip overlying the insulating layer which is formed on the major surface of the semiconductor substrate 40. The second semiconductor region 42 also includes a contact 45 which makes physical and electrical contact therewith. A corresponding aluminum layer or strip 31 makes electrical connection with the contact 45 and extends over the insulating layer on the surface of the semiconductor substrate 40.

Three gate electrodes 19, 22, and 25 are provided overlying and electrically insulated from the major surface of the semiconductor substrate and disposed between the semiconductor regions 41 and 42. Gate electrodes 19 and 25 are first or lower level polysilicon gates and gate 22 is a second or upper level polysilicon gate which slightly overlies a portion of both gates 19 and 25. These gates are separated from the major surface of the semiconductor wafer and from each other by means of the insulating layer (not shown). Various signal lines are provided which make electrical contact with the gate electrodes. The signal line 18 makes contact with the gate electrode 19 at the contact 20. The gate associated with gate electrode 19 may also be referred to as the "meter gate", or gate $G_1$. The signal line 21 makes contact with the gate electrode 22 by means of the contact 23. The gate associated with gate electrode 22 may be referred to as the "storage gate", or gate $G_2$. The signal line 24 makes contact with the gate electrode 25 at the contact 26. The gate associated with gate electrode 25 may be referred to as the output transfer gate, or gate OTG. The signal lines 18, 21, and 24 are preferably conductive strips composed of aluminum and are disposed on the surface of the insulating layer over the semiconductor substrate.

FIG. 2 also shows the amplifier portion 13 of the circuit according to the present invention including a second semiconductor region 15 of a second conductivity type (i.e. n type) adjacent the major surface and extends from the surface to a predetermined depth into a body. The second semiconductor region 15 is spaced from the first semiconductor region 14 and electrically isolated therefrom by the substrate 40. This second semiconductor region of second conductivity type further contains first and second spaced-apart semiconductor subregions 43 and 44 respectively of the same second conductivity type adjacent said major surface. The first and second subregions have a second conductivity type forming dopant concentration higher than that of the second semiconductor region itself, such as having n+ type conductivity. Such first and second subregions form the source and drain zones of a field effect transistor which is used as an amplifier for the output signal generated in the present circuit. A first signal line 32 is physically and electrically connected to the first subregion 43 by means of the contact 33. A second signal line 34 makes physical and electrical contact with second subregion 44 by means of the contact 35. The source and drain electrodes may therefore be connected to other elements of the circuit in order to further amplify or utilize the signal, as is known by those skilled in the art.

FIG. 2 also shows the reset means according to the present invention. The reset means is formed by a field effect transistor, including a reset gate electrode 47 and a third semiconductor subregion 46 which is adjacent the major surface of the semiconductor body and lies within the first semiconductor region 14 described above. The third subregion 46 has a second conductivity type forming dopant concentration higher than that of the second semiconductor region itself, such as having n+ type conductivity, and is spaced apart from the second subregion 42 so that the regions 42 and 46, together with the gate electrode 47 form a field effect transistor. The reset gate electrode 47 is composed preferably of polysilicon and is disposed on the insulating layer (not shown) which lies over the semiconductor structure, and is situated so that its projection normal to the surface of the substrate 40 lies between the second and third subregions 42 and 46 so as to form an insulated gate of a field effect transistor having the source and drain zones constituted by the second and third subregions 42 and 46 respectively. A signal line 48 makes contact with the gate electrode 47 at a contact 49.

A signal known as a reset gate (RG) signal is applied during a third subsequent time interval for the purpose of making the field effect transistor constituted by the subregions 42 and 46 and gate electrode 47 conductive so as to drain the charge located on the output gate 31 at an appropriate time, thereby "resetting" the storage gate to receive further charge from the input. A signal line 50 is further provided which makes contact with the second subregion 46 at the contact 51, which functions to DC bias the amplifier gate during reset.

Figure 3A:
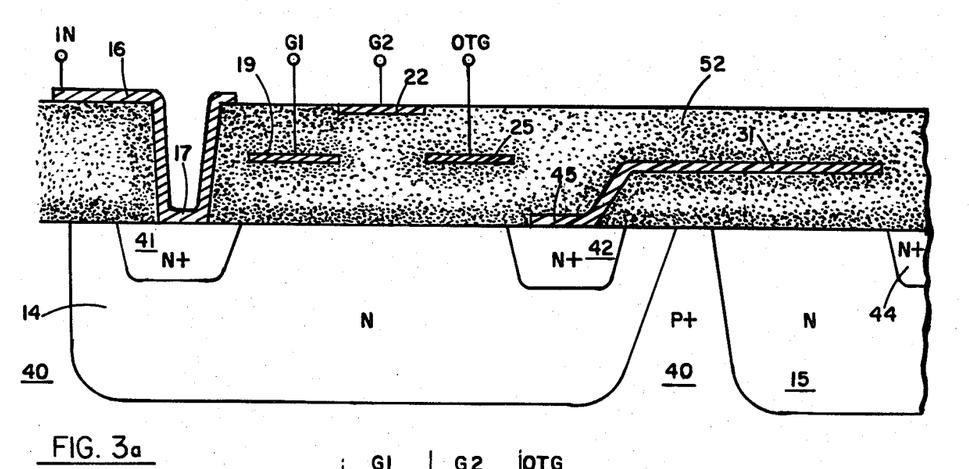
FIG. 3(a) is a cross-sectional view of the semiconductor circuit shown in FIG. 2 through the III—III plane.
Figure 3B:
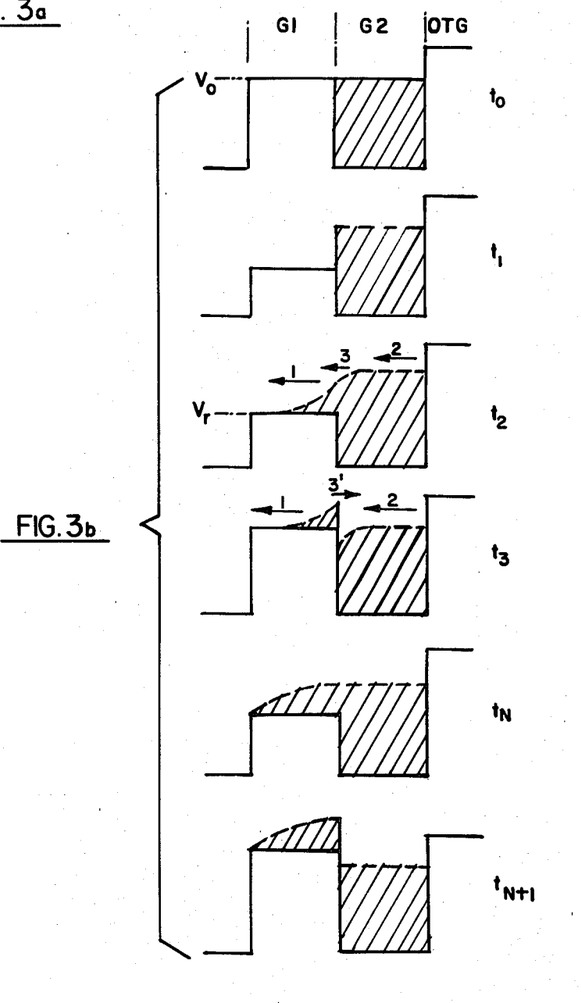
FIG. 3(b) is a potential diagram of the potential in the semiconductor body under the illustrated electrodes.

FIG. 3a is a cross-sectional view of the semiconductor circuit shown in FIG. 2 through the III—III plane. FIG. 3b shows a sequence potential diagram of the electrical potential in the semiconductor body adjacent the major surface in a region corresponding to the region shown in FIG. 3a at successive periods of time. The elements shown in FIG. 3 and labeled by reference numerals have the same meaning as the corresponding elements in FIG. 2, e.g. the input line 16, contact 17, semiconductor body 40, first semiconductor region 14 and second semiconductor region 15, first semicoductor subregion 41 and second semiconductor subregion 42, the third semiconductor subregion 44, gate electrodes 19, 22, and 25, output line 31 and contact 45. FIG. 3a shows the layer of electrically insulating material 52, preferably silicon dioxide, which overlies the major surfaces of the semiconductor body 40 and the semiconductor regions, and electrically insulates the gate electrodes 19, 22, and 25 from the silicon surface, as well as insulates the gate electrode 31 from the surface of the second semiconductor region 15.

The potential diagrams in FIG. 3b in particular indicate the potential level under gate 19 (or $G_1$), under gate 22 (or $G_2$), and under the gate 25 (or the output transfer gate (OTG)). According to the present invention the radio frequency input signal is applied to Gate $G_1$, a fixed bias potential is applied to gate $G_2$, and the clock pulse $\phi_2$, as will be described subsequently, is applied to the output transfer gate 25. In the sequence of potential diagrams shown in FIG. 3b, a pulse does not appear on the output transfer gate and thus the potential under the semiconductor region under that gate remains constant during the time period considered.

FIG. 3b shows a sequence of four potential well diagrams taken at successive time interval $t_0$, $t_1$, $t_2$, and $t_3$, and two further potential well diagrams at a much later time during subsequent time intervals $t_N$ and $t_{N+1}$. During the period of time from $t_0$ to $t_3$ the potential barrier under the gate $G_1$ is seen to decrease from the period $t_0$ to $t_1$ and increase from the period $t_2$ to $t_3$. During this time period the stored charge in the region under the gate $G_2$ slowly begins to diffuse in the left hand direction. At time $t_0$ the potential underneath the gate $G_1$ is at a potential level $V_1$, and at the time $t_1$ the potential under the gate $G_1$ is at a lower level. The level $V_{IN}$ is the initial input voltage applied to the charge storage areas by means of the input line 16. The shaded portion represents charge storage in the semiconductor region between the subregions 41 and 42.

The first of the six potential diagrams at $t=t_0$ shows the $G_2$ gate storage charge equilibrated to the DC bias on the $G_1$ gate. Actually, this DC signal equlibration occurs simultaneously with the RF signal, but the superposition principle allows one to treat them separately. At $t=t_1$, the first positive half cycle of the RF signal voltage applied to gate $G_1$ begins exposing the stored charge to a lower potential. This half cycle concludes at $t=t_3$. The third potential diagram represents the situation at $t=t_3$, just before the half cycle conclusion. At this point, a small amount of charge has spilled out of the storage well, but the effective pulse width is so short at millimeter wave frequencies that very little charge transfer has occurred. Nevertheless, a charge diffusion pattern is emerging that can be divided into three parts denoted by the arrows 1-3. Arrow 1 is a slow diffusion of charge under the $G_1$ gate and $G_2$ has a slow diffusion component labeled by arrow 2. These two diffusion components proceed independent of the sinewave cycle through an application of the superposition principle. A third component labeled by arrow 3 represents a fast charge transfer occurring at the gate boundary. In the fourth diagram at $t=t_3$ the polarity of the RF signal has changed, raising the $G_1$ gate potential. This in turn raises the $G_1$ charge potential so that charge at the $G_1$ boundary flows back to the $G_2$ well. This charge diffusion is denoted by arrow 3'. The net result is the two opposite faste diffusions, 3 and 3', cancel during an RF cycle while the slow diffusions continue without interruption. A cycle that occurs around $t=t_N$ and $t_{N+1}$ ($n>>1$), a much later time, is illustrated in the final two diagrams. Here it is seen that the slow diffusion has resulted in a cosine profile for the exposed excess charge originally in the $G_2$ well.

Since the fast diffusion alternates direction giving no net transfer, and the superposition principle holds in this linear system, it is justified to neglect the fast diffusion and treat just the slow diffusion. The time allowed for the slow diffusion is the total time between the $\phi_1$ input diffusion pulse and the $\phi_2$ output transfer gate pulse which can be 1 $\mu$s or longer. This is plenty of time to spill the excess charge and equilibrate the $G_2$ stored charge to the $G_1$ potential minimum determined by the RF signal amplitude.

Figure 4:
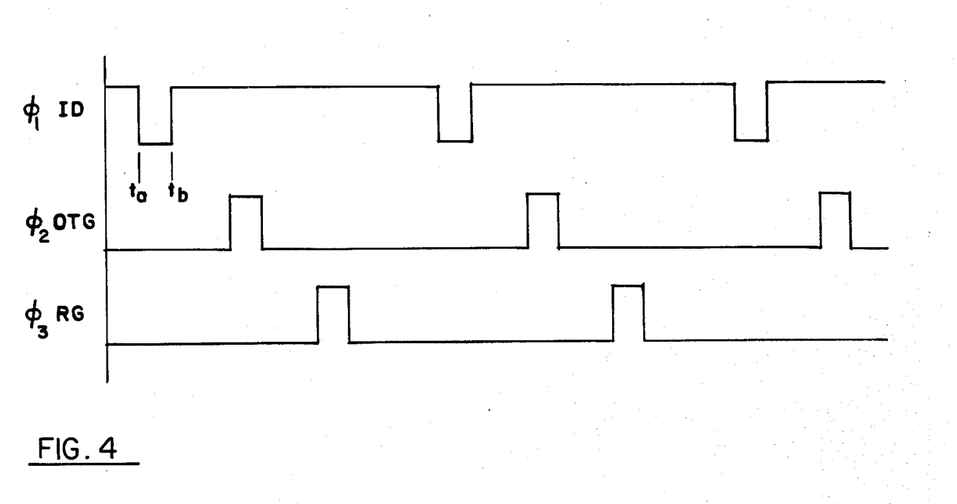
FIG. 4 is a timing diagram of the signal waveforms applied to the gates of the semiconductor device according to the present invention.

FIG. 4 is a timing diagram of the signal waveforms applied to the gates of the semiconductor device according to the present invention. The first timing signal is the timing signal applied to the input diffusion line 16 and is labeled $\phi_1$ in FIG. 4 as well as in FIG. 1. The signal $\phi_1$ remains essentially high (or at ground potential) until a time $t_A$ at which point it drops to a relatively negative potential where it remains for a predetermined time as short as a few nanoseconds. After such period has elapsed, at $t_B$, the signal returns to ground potential where it remains until the cycle is continued. Such a signal occurs during a first time interval and functions to inject charge into the charge storage region thereby filling the storage well under the gate $G_2$ to a level determined purely by the height of the potential well under the level $G_1$. This is represented on the FIG. 3 by time $t_0$ in which the storage well under the gate $G_2$ has been filled exactly to the height of the signal applied to the gate $G_1$. This initiates the sample aperture which ends when the output transfer gate is pulsed.

Figure 5:
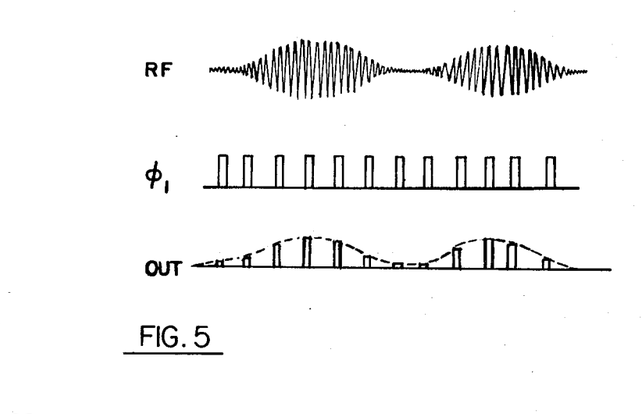
FIG. 5 is a timing diagram of the operation of the present invention in demodulating an applied ratio frequency signal.

The $\phi_2$ signal shown in FIG. 5 applied to the output transfer gate is defined by a waveform going from a relatively negative voltage level to a relatively positive level for a time interval of at least 100 ns. for a typical 6 $\mu$m gate dimension. The function of the output transfer gate signal is to transfer the charge stored in the region underneath $G_2$ into the semiconductor region 42 and thence onto the gate 31.

The final third timing diagram shown in FIG. 5 is the $\phi_3$ signal applied to the reset gate (RG) which in FIG. 1 is the gate 47. The $\phi_3$ waveform changes from a relatively low voltage to a relatively high voltage, and remains at the relatively high voltage for a period of at least 100 ns. which occurs during a third time interval subsequent to the second and the first time interval.

Following the sequence of consecutive pulses associated with waveforms $\phi_1$, $\phi_2$, and $\phi_3$ respectively, the cycle repeats itself with a $\phi_1$ pulse as is shown in the diagram in FIG. 4. The output proportional to the RF signal amplitude appears as a pulse at the output FET source line 32 in the time between the $\phi_2$ and $\phi_3$ pulses.

FIG. 5 is a timing diagram of the operation of the present invention in demodulating the applied radio frequency signal. The FIGURE's first waveform shows the typical amplitude modulated radio frequency signal that might be applied to the $G_1$ gate a frequency f. The second waveform shown is the sample pulse or the $\phi_1$ waveform. It is noted from the diagram that the sample frequency of $\phi$ is much less than the frequency of the RF signal, so that the sample frequency undersamples the applied radio frequency signal. The third shows the output waveform produced by the present invention having as an input the radio frequency input signal shown in FIG. 4. The output signal represents the demodulation of the radio frequency signal shown above in FIG. 4. The output signal shown in FIG. 4 is produced by a voltage or current variation of a signal in the conduction path of the field effect transistor defined by 43, 31, and 44 in FIG. 2.

Figure 6:
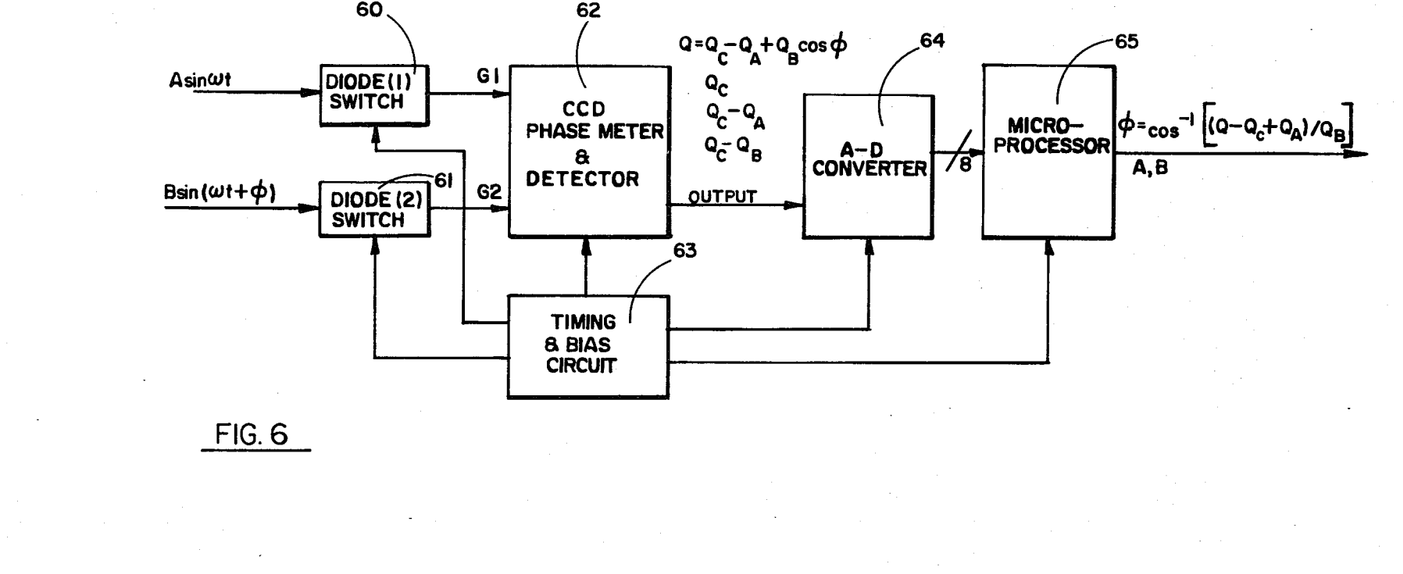
FIG. 6 is a block diagram of an application of the demodulator system according to the present invention as a phase meter.

FIG. 6 is a highly simplified block diagram of an application of a CCD demodulator according to the present invention as a phase meter, which functions to distinguish the phase of two applied signals. Alternatively, the present invention may be used in performing detection of a phase modulated signal, in which case one of the signals applied to the demodulator is a reference signal having a known phase.

The signals $S_1$ and $S_2$ are applied to two diode switches 60 and 61 respectively. As an example of two different signals of different amplitude and phase, signal $S_1$ is represented as being of the form $A \sin \omega t$ and signal $S_2$ is represented as being of the form $B \sin (\omega t + \phi)$, where A and B are constants, $\omega$ is frequency and t is time. Each of the diode switches have two possible positions, either an "on" or an "off" state. Control of the diode switches is performed by the timing and bias circuit 63. In one modulation period, the diode switches go through each of the four possible combination of positions:

diode switch 60 on, diode switch 61 on
diode switch 60 on, diode switch 61 off
diode switch 60 off, diode switch 61 on
diode switch 60 off, diode switch 61 off The selection of the positions of the diode switches is performed by the timing and bias circuit 63 in a predetermined order so that in four equal and successive time intervals, each position is selected. The output of the two diode switches are applied to the gates $G_1$ and $G_2$ of the CCD demodulator as shown in FIG. 3a.

Figure 7:
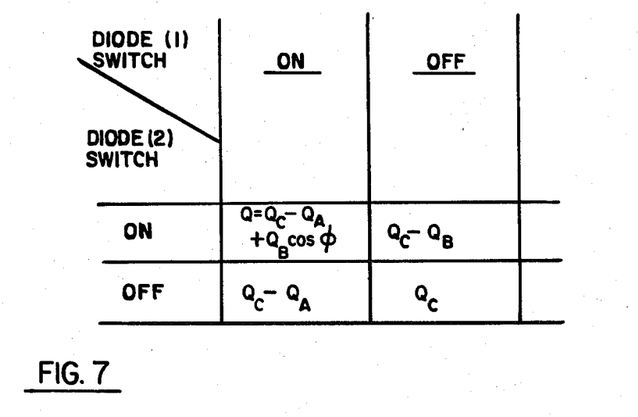
FIG. 7 is a chart showing the output of the CCD phase meter and detector according to the present invention depending upon the operation of two diode switches.

The output of the CCD demodulator (which is now labeled as a "CCD phase meter and detector") in block 62, takes one of four possible values depending upon the settings of the diode switches 61 and 62. The four possible output values Q are shown above the output line by $Q = Q_C - Q_A + Q_B \cos \phi$, $Q_C$, $Q_C - Q_A$, and $Q_C - Q_B$. The value $Q_C$ is defined as the voltage output of the demodulator 62 when no time-varying signal is applied to the input gates (i.e. a DC bias signal is alone applied to the gates). $Q_A$ is a voltage proportional to the input amplitude A, and $Q_B$ a voltage proportional to the input amplitude B. Which of these Q values are output by the demodulator 62 is determined according to the settings of the diode switches 61 and 62 at a specific time as is shown in FIG. 7. Note that when both AC signals are applied to demodulator 62 (i.e. A sin $\omega t$ and B sin $(\omega t + \phi)$) the output has a term proportional to cos $\phi$, where $\phi$ is the phase difference.

The output of the CCD phase meter 62 is an analog signal which may preferably by converted to a digital signal for further processing. The analog output signal is therefore applied to a conventional A/D converter 64 which converts the analog output from the CCD output gate to a digital signal for such further processing. The output of the A/D converter 64 is shown as an 8-bit data output line applied to a microprocessor 65. The timing and bias circuit 63 provides timing and bias signals to the A/D converter 64 as well as the microprocessor 65. The four output values for Q for one modulation period are used in the microprocessor 65 to calculate in real time the amplitudes of the two applied signals and their phase difference. The phase difference $\phi$ may be calculated for each modulation period by use of the formula $\phi = \cos^{-1}[(Q - Q_C + Q_A)/Q_B]$. The specific choice of a microprocessor and the programming thereof for use in the described application would be within the skill of a person familiar with the programming art. Temperature and bias drift are accounted for by the $Q_C$ output. Signal amplitude variations are accounted for by the $Q_C - Q_A$ and $Q_C - Q_B$ outputs.

One important application for the present invention as a phase meter is in a data transmission system for sending digital data between a transmitter and a receiver over a transmission line, in which predetermined phase differences and predetermined amplitude levels are established in a carrier signal during successive modulation periods representative of preselected data combinations. The demodulator at the receiver according to the present invention functions to detect the phase differences and the amplitude levels and restore the digital data to its original format.

In such an application the phase and amplitude modulated carrier signal is applied to the input of one of the diode switches, e.g. diode switch 60, and a reference signal applied to the other diode switch, e.g. diode switch 61. The diode switches 60 and 61 are then sequentially switched on and off by the timing and bias circuit 63 so that the four possible output signals are generated. As explained above, the output signals are applied to the A/D converter 64 to produce digital signals which are applied to the microprocessor 65. The microprocessor produces a multibit digital output representing the phase difference between the input signal and the reference signal.

Figure 8:
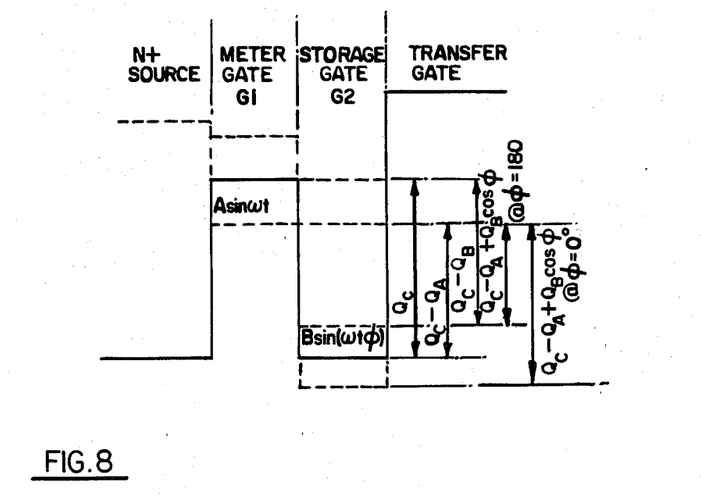
FIG. 8 is a potential diagram of the potential in the semiconductor body under the active electrodes of the CCD detector shown in FIG. 6.

FIG. 8 is a potential diagram of the potential in the semiconductor body under the gates $G_1$, $G_2$, and the output transfer gate under various conditions. Each of the levels of potential shown in the diagram of FIG. 8 are labeled according to the potential which has been applied to the gate and therefore which is reflected in the potential level in the semiconductor body under the respective gate. The minimum difference in levels between gates $G_1$ to $G_2$ is represented by the arrows shown on the right hand portion of the figure and is proportional to the device output. These different signals are as follows:

$Q_C$ is the difference between the DC meter gate and storage gate potentials and is proportional to the DC output.

$Q_C - Q_A$ is the difference between the DC storage gate potential and the minimum AC modulated meter gate potential and is proportional to the AC signal amplitude, A, and the DC+AC amplitude output.

$Q_C - Q_B$ is the difference between the DC meter gate potential and the maximum AC modulated storage gate potential and is proportional to the AC signal amplitude, B, and the DC+AC amplitude output.

$Q_C - Q_A + Q_B \cos \phi$ at an angle $\phi = 180°$ is the difference between the minimum AC modulated meter gate potential and the maximum AC storage gate potential or $Q_C - Q_A - Q_B$ and is proportional to the device output.

$Q_C - Q_A + Q_B \cos \phi$ at an angle $\phi = 0°$ is the difference between the minimum AC modulated meter gate potential and the minimum AC storage gate potential or $Q_C - Q_A + Q_B$ and is proportional to the device output.

It will be obvious to those skilled in the art that the semiconductor device according to the present invention can be manufactured with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}-B_V$ compounds, may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

While the invention has been illustrated and described as embodied in a CCD Demodulator Circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A charge coupled demodulator circuit including a radio frequency input, and an output, comprising:

first input means for introducing into a first position of said circuit a predetermined amount of charge;

storage well means functioning to store a predetermined amount of charge in a second portion of said circuit spaced apart from said first portion;

second input means for introducing a time-varying radio frequency signal having a frequency f containing information in the form of amplitude modulation into the circuit; said second input means functioning to cause charge to be transported during a first time interval from said first portion to said second portion, and during a subsequent second time interval from said second portion in the direction of said first portion, so that at the end of a single first and a predetermined plurality of subsequent successive second time intervals corresponding to a plurality of cycles of said radio frequency signal a quantity of charge remains in said storage well representative of the demodulated amplitude of said time-varying radio frequency signal; and sampling means connected to said storage well for sampling and transferring at a sampling frequency less than said frequency f said quantity of charge remaining in said storage well means during a third time interval subsequent to said predetermined plurality of second time intervals to said output.

2. A demodulator circuit as defined in claim 1, wherein said circuit is implemented as a monolithic circuit on a semiconductor body.

3. A demodulator circuit as defined in claim 2, wherein said semiconductor body comprises a first semiconductor layer of a first type conductivity, a second semiconductor layer of a second type conductivity at least in part disposed below said first semiconductor layer;

a first region of a semiconductor material of said first type conductivity in said first layer and connected to said first input means for locally introducing into said first semiconductor layer information in the form of charge consisting of majority charge carriers of said first layer;

said output including a second region of semiconductor material of said first type conductivity in said first layer and spaced apart from said first region; and electrode means above the upper surface of said first semiconductor layer and electrically insulated therefrom for capacitively generating electric fields in the first semiconductor layer upon application of a suitable signal to said electrode means to cause charge to be transported through the first layer from said first region to said second region in a direction parallel to said layer.

4. A demodulator circuit as defined in claim 1, wherein:

said output is disposed adjacent to said sampling means for receiving said quantity of charge remaining in said storage well during said third time interval.

5. A demodulator circuit as defined in claim 4, further comprising an output gate electrically connected to said output for receiving the charge transferred by said sampling means from said storage well.

6. A demodulator circuit as defined in claim 5, further comprising a reset gate for draining the charge from said output gate during a fourth time interval subsequent to said third time interval.

7. A demodulator circuit as defined in claim 5, further comprising a signal amplifier connected to said output gate.

8. A demodulator circuit as defined in claim 7, wherein said signal amplifier comprises a field effect transistor having first and second conduction path electrodes, and a control electrode connected to said output gate.

9. A demodulator circuit as defined in claim 1, wherein said frequency f is in the gigaHertz frequency range.

10. A charge coupled device demodulator circuit structure comprising:

a body of semiconductor material of a first conductivity type and having a major surface including a plurality of circuit elements;

a first semiconductor region of a second conductivity type adjacent said major surface and extending from said surface to a predetermined depth into said body, said first region forming a channel in said semiconductor body through which charges can be caused to flow when said circuit elements are appropriately biased;

a second and a third semiconductor spaced apart region of said second conductivity type adjacent said major surface in said channel, said second and third regions having a second conductivity type forming dopant concentration higher than that of said first semiconductor region;

input means connected to said second semiconductor region for applying a predetermined electric charge thereto during a first time interval;

a portion of said first semiconductor region lying between said second and third semiconductor regions forming charge storage regions for storing different predetermined amounts of charge;

biasing means to cause charge flow through said portion of said first semiconductor region, said biasing means including signal input means for establishing a potential well in said portion of said first semiconductor region having a depth which varies as a function of a time-varying applied signal, said signal input means introducing a time varying radio frequency signal having a frequency f containing information in the form of amplitude modulation and functioning to transfer charge from said second semiconductor region to said portion of said first semiconductor region during a first time interval until charge equilibrium has been established; and means for sampling charge from said portion of said first semiconductor region at a sampling frequency less than said frequency f and transferring such charge to an output.

11. A charge coupled device demodulator circuit comprising:

a body of semiconductor material of a first conductivity type having a major surface in said body including a channel adjacent said major surface along which charge may be propagated;

an insulating layer deposited upon said major surface of said body of semiconductor material;

a first and a second semiconductor spaced apart region of a second conductivity type adjacent said major surface in said channel, said first and second regions having a second conductivity type forming dopant concentration higher than that of said body of semiconductor material;

electrode means above the major surface of said semiconductor body and electrically insulated therefrom by said insulating layer, said electrode means functioning to capacitively generate electric fields in the semiconductor body upon application of a suitable signal to said electrode means to cause charge to be transported through said channel from said first region to said second region in a direction parallel to said layer;

a modulated time-varying signal input line overlying said major surface and connected to said electrode means for providing an amplitude modulated time-varying input signal having a frequency f;

sampling means for sampling the modulated time-varying input signal at a sampling frequency less than said frequency f, the sample signals being constituted by electrical charges capable of moving in said channel;

a charge storage region formed in said channel in said body for forming and storing a predetermined quantity of charge during a first time interval, said quantity corresponding to the sample signal derived from the respective time-varying signal and representative of the demodulated amplitude of said time-varying input signal;

transfer means disposed on said major surface adjacent said channel for transporting the stored charges from said channel during a second subsequent time interval; and output means disposed on said major surface adjacent to said transfer means and functioning to store the accumulated charge derived from said channel during a third predetermined time, the charge stored on said output means being an analog representation of the magnitude of the time-varying signal applied to said signal input line during said first time interval.

12. A device as defined in claim 11 further comprising reset means for dissipating said accumulated charge from said output means during a fourth subsequent time interval.

13. A device as defined in claim 12 wherein said reset means comprises a field effect transistor disposed in said first body of semiconductor material.

14. A device as defined in claim 13 wherein said sampling means comprises a sample input formed by a region of semiconductor material of first conductivity type in said body.

* * * * *